United States Patent [19]
Barber et al.

[11] Patent Number: 5,471,518
[45] Date of Patent: Nov. 28, 1995

[54] METHOD AND APPARATUS FOR NON-VOLATILE DATA STORAGE IN RADIO TELEPHONES AND THE LIKE

[75] Inventors: Douglas K. Barber; Stephan W. Hortensius, both of Calgary, Canada

[73] Assignee: NovAtel Communications Ltd., Calgary, Canada

[21] Appl. No.: 104,870

[22] Filed: Aug. 10, 1993

[51] Int. Cl.⁶ .................................................. H04M 11/00
[52] U.S. Cl. ............................................. 379/58; 365/218
[58] Field of Search ............................. 379/58; 365/185, 365/189.01, 200, 218, 900

[56] References Cited

U.S. PATENT DOCUMENTS

| | | |
|---|---|---|
| 4,763,305 | 8/1988 | Kuo . |
| 4,780,855 | 10/1988 | Iida et al. . |
| 5,126,808 | 6/1992 | Montalvo et al. ................. 365/189.01 |
| 5,185,718 | 2/1993 | Rinerson et al. ................. 365/189.01 |
| 5,199,074 | 3/1993 | Thor ........................................ 380/50 |
| 5,297,148 | 3/1994 | Harari et al. ............................ 365/200 |
| 5,327,384 | 7/1994 | Ninomiya ................................ 365/900 |

FOREIGN PATENT DOCUMENTS

| | | |
|---|---|---|
| 0340981 | 11/1989 | European Pat. Off. . |
| 0373611 | 6/1990 | European Pat. Off. . |
| 0398545 | 11/1990 | European Pat. Off. . |
| 0489204A1 | 6/1992 | European Pat. Off. . |
| 2687811 | 8/1993 | France . |
| 3143136 | 5/1983 | Germany . |

OTHER PUBLICATIONS

IEEE article "A 4Mb–5V–Only Flash EEPROM with Sector Erase", from the 1990 Symposium on VLSI Circuits, Stiegler et al., Feb. 1990.
Electronic Engineering Times article "Intel rolls first sector–erase flash EPROM", Thompson, May. 1991.
Electronic Engineering Times article "Programmers Wrestle with Bulk–Erase Devices Flash design a hot issue", Baker, Nov. 1991.

Primary Examiner—Curtis Kuntz
Assistant Examiner—Dwayne D. Bost
Attorney, Agent, or Firm—Cesari and McKenna

[57] ABSTRACT

A cellular telephone (10) stores both the programming for its processor (18) and certain changing parameters in the same flash-memory device (36). The device is sectored so that the changeable parameters can be erased without erasing the program contents, and they are stored and fetched in an associative manner so that erasures are required only infrequently.

5 Claims, 3 Drawing Sheets

METHOD AND APPARATUS FOR NON-VOLATILE DATA STORAGE IN RADIO TELEPHONES AND THE LIKE

BACKGROUND OF THE INVENTION

The present invention is directed to storage of data in nonvolatile memory. It has particular, although not exclusive, applicability to portable telephones.

The portable digital cellular telephone presents a severe packaging and power-consumption problem. For maximum convenience, the cellular-telephone circuitry—audio and radio-frequency circuitry as well as circuitry for performing the complex data processing required to extract and decode multiplexed-channel signals—should be completely contained in a single, small handset. Moreover, it is important that the user not be required to replace or recharge batteries with excessive frequency. So the circuitry should be provided in as few integrated-circuit devices as possible, and each device that is used should occupy a minimum of space and require very little power.

These requirements extend to the memory circuitry that the telephone employs. To perform the necessary operations, the telephone must include a microprocessor or dedicated digital-signal-processing integrated circuit that operates in response to fixed programming, or "firmware." The firmware typically is stored in read-only memory ("ROM"), which retains its contents even when power is removed, so it causes no battery drain when the telephone is not actually in use.

Other data, such as signal samples and intermediate results of various calculations, are not fixed, and they need to be stored in memory whose contents can be both read and written. The term used for the type of memory ordinarily employed for this purpose is RAM, for "random-access memory," although access to most ROM, too, is random in the sense that the time required to access a given data word is independent of that data word's location. The smallest and most-inexpensive RAM used for this purpose is *volatile;* i.e., it loses its contents when power is removed. Signal samples and intermediate computation results do not need to be remembered between uses, so this volatility is acceptable.

But there is an intermediate type of information for which volatility is not acceptable but that must be changed from time to time. Such information can, for instance, be volume settings, speed-dial numbers, accumulated-air-time data, and so forth. Since such information changes, it cannot be stored in ROM, but energy usage would be excessive if it were stored in the same conventional, volatile RAM employed for other purposes, because the RAM circuitry could never be removed from a power source.

To avoid this problem, one can employ a separate, dedicated RAM chip powered by a separate, long-term battery. Although this approach can be made to work, it places undesirable limits on product life and circuit miniaturization.

Another approach is to employ an electronically erasable programmable read-only memory ("EEPROM"). The contents of such a device can be written as well as read, yet it retains its contents when power is removed. Although such memory would seem to be a natural for this application, it unfortunately is several times as large as a conventional ROM of the same data capacity. It therefore presents the designer with two unattractive alternatives. He can employ a single EEPROM for both firmware and changeable parameters and thereby require much more space than otherwise to store the (typically large amount of) firmware, or he can employ conventional ROM for the firmware and a separate EEPROM for the changeable parameters and thereby suffer a device-count increase.

SUMMARY OF THE INVENTION

We have recognized that these drawbacks can be overcome by instead employing a flash memory. A flash memory is a non-volatile read/write memory, but it requires much less space than an EEPROM of the same memory capacity. The use of a flash memory would nonetheless have appeared unattractive heretofore because the manner in which its contents can be changed is relatively inflexible.

Specifically, bit cells can be written selectively only to one of the two logic states, which we will arbitrarily refer to here as the ZERO logic state. A bit cell can be placed in the other, ONE logic state only by erasing, i.e., by placing all bit cells in that state simultaneously. The contents of a given location therefore cannot in general be written to an arbitrary value without erasing and rewriting the contents of all other memory locations. Such a requirement makes flash-memory storage, as conventionally practiced, impractical if a single device is to store both program instructions and changeable data: the time and memory required to store the typically voluminous programming information temporarily and then rewrite it would usually be prohibitive.

Another feature that would heretofore have seemed to make use of a flash memory impractical for this application is its short useful life. Each erasure causes significant memory wear, and flash memories tend to fail after a limited number of erasures.

We have overcome these shortcomings by using a flash memory of the "sectored" type. A *sectored* flash memory is a single device divided into a small number of sectors. Like the bit cells of a conventional flash memory, those of a sectored flash memory cannot be changed selectively to ONEs. But changing a single bit cell to a ONE requires only that all bit cells be erased to the ONE state in the same sector; locations in other sectors of the same device can remain unaffected. If the firmware is stored in one sector, therefore, and the changeable data are stored in others, changing a given changeable parameter requires temporary storage and rewriting of only the (typically small number of) changeable parameters, not of the entire program store.

Without more, this approach would still be subject to the wear problem because the number of required erasures would be substantially the same as in conventional operation. But we have devised a way of avoiding the need for erasures in most instances in which the value of a changeable parameter must be revised. Our approach is to operate the changeable-parameter storage sector in what is sometimes called an "associative" manner. Specifically, we treat each memory location as comprising two parts, namely, a tag part and an information part, and we associate each information item with a respective tag value. To fetch, say, the volume data, we search the (typically relatively small) changeable-parameter sector for any location whose tag part indicates that the memory location contains the volume data, and the volume data are then fetched from the information part of that location.

This enables us to reduce the frequency with which erasures must be performed. Since all bit cells contain ONEs when a sector has been erased, data can initially be placed into a memory location by selectively writing only ZERO bits into individual cells in the tag and information parts of the memory location. After the initial information has been written, the tag portions of a few memory locations contain some ZEROs, which indicate that those locations have been used, while the remainder contain all ONEs, which indicate that those locations have not been used and thus can still be written to any value by selectively writing only ZEROs.

So when the volume level is later to be changed, the sector containing it need not ordinarily be erased. Instead, ZEROs are written into all bit cells of the memory location that contains the previous volume level—at least, if that location's contents cannot be changed to the new value without writing ONEs—and the new value is then placed into a previously unused location, which is distinguished by all ONEs in its tag part. The tag contents are then changed to the volume-indicating value, and the volume value is thereby ready to be fetched again when needed.

In this way, erasures are required only when all locations in the sector have been used. And since the number of changeable parameters is typically quite small in comparison with, say, the size of the required program memory, enough excess changeable-parameter memory can be provided to make an erasure necessary only infrequently.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 1:
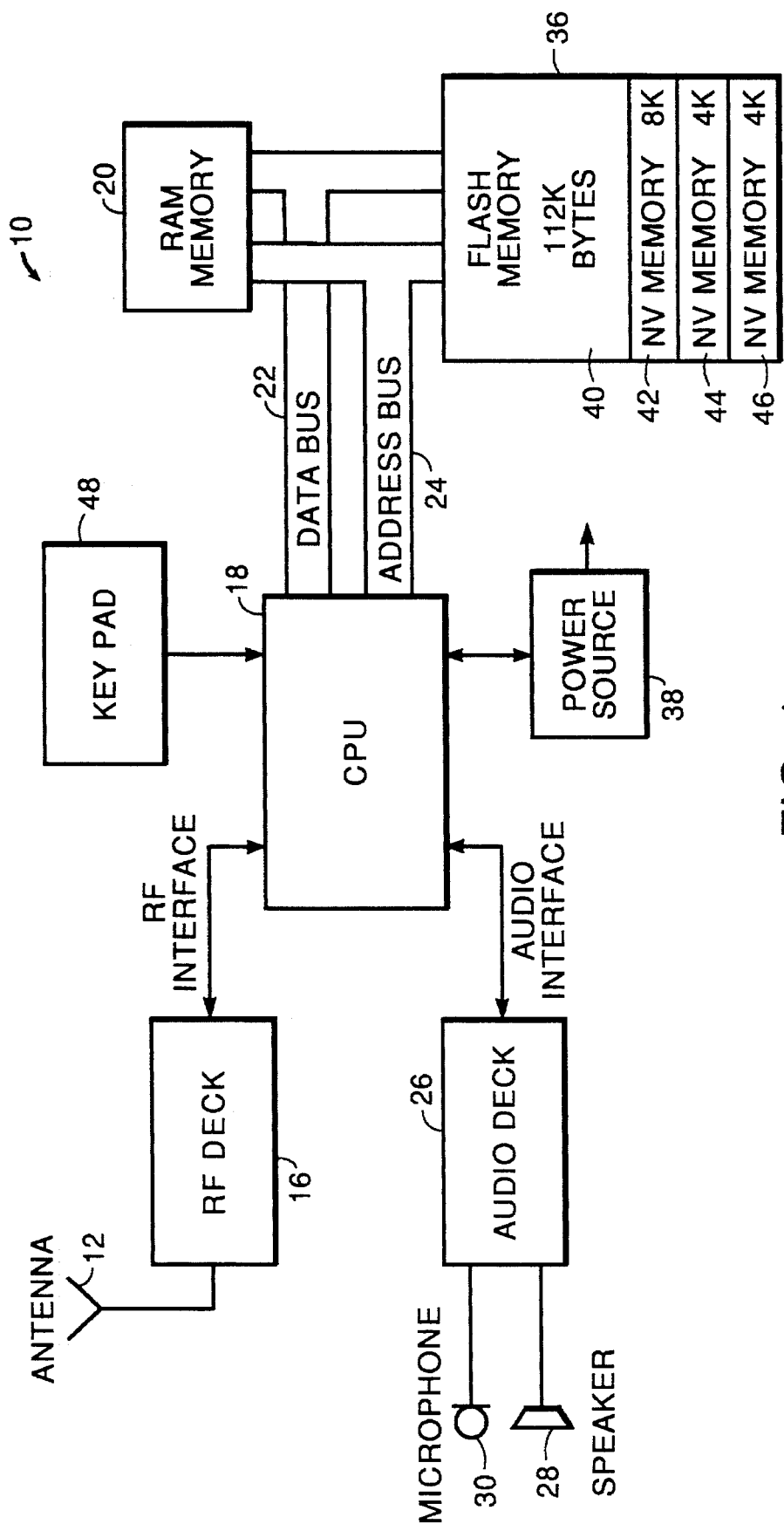
FIG. 1 is a block diagram of a typical cellular telephone in which the teachings of the present invention have been implemented.

FIG. 1 is a block diagram of a typical cellular telephone 10 that employs digital signal processing. Radio signals received at an antenna 12 are filtered, frequency translated, sampled, and converted to digital form in a radio section, RF deck 16. By way of appropriate input/output circuitry, the data signals are passed to a central-processing unit 18, which is typically a dedicated digital signal processor. Processor 18 processes the samples, storing them and intermediate calculation results in a conventional, volatile random-access memory 20. The RAM accesses are typically performed over a digital-communication channel shown by way of example as being of the type that includes separate data and address buses 22 and 24, although multiplexed buses may be used instead. By appropriate processing, the central processing unit 18 extracts audio information and applies data signals containing it to an audio section, audio deck 26, which converts the digital signals to analog form, typically with some filtering. A speaker 28 receives the analog electrical signals and converts them to sound. For transmission, the user speaks into a microphone 30, which converts the sonic signals into analog electrical signals that the audio deck appropriately filters, samples, and converts to digital signals. The processing unit 18 appropriately encodes those digital signals and applies the results to the RF deck 16 to cause it to transmit information thus encoded over the antenna 12.

A flash memory 36 contains the program instructions that the central processing unit executes to perform the various signal-processing routines. The flash memory is a read/write memory that provides nonvolatile storage. A power source 38 provides power to all of the circuitry during active use. When the telephone is turned off, that power is removed from both the RAM 20 and the flash memory 36, but the flash memory 36 retains its contents, while RAM 20 does not.

In accordance with the present invention, flash memory 36 is of the "sectored" type. Like the bit cells of all flash memory, those of memory 36 can be written selectively only to the ZERO state. A bit cell can be erased to the ONE state only by erasing many other bit cells. But flash memory 36 is *sectored*: it is divided into sectors 40, 42, 44, and 46, and erasure of a bit cell in any given sector requires erasure of all of the other bit cells in only that sector, not in any of the others.

In the illustrated embodiment, the flash memory is a 128-kilobyte memory in which sector 40 contains 112K, sector 42 contains 8K, and sectors 44 and 46 contain 4K apiece. Sector 40 is in the program address space of the processor 18, which fetches all or most of its instructions from that sector. Although the programming is intended to be essentially permanent, it may be necessary or desirable to upgrade the telephone by changing that memory at some point, and this can be done by rewriting the contents of that sector. Since the telephone designer will often recognize that certain parts of the programming are more likely to require updating than others, he may place such parts in a second sector, such as the 8K sector 42, and thereby facilitate updating by requiring erasure and temporary storage of only 8K if he is sufficiently prescient concerning which code is likely to require updating.

In the course of executing the program instructions contained in sectors 40 and 42, the central processing unit 18 will often have to fetch parameters that are changeable but should be retained between telephone uses and thus cannot be stored in the RAM 20. Much of this information, such as desired volume levels and speed-dial numbers, may have been entered from the user's key pad 48, while other information is in the nature of logging information, which the processor 18 stores automatically.

In any event, the programming in sectors 40 and/or 42 directs the central processing unit 18 to store such information in and fetch it from sector 44 or 46. Access to the RAM 20 and to sectors 40 and 42 typically occurs on a random-access basis: the central processing unit applies the desired address (and appropriate control) signals to the memory, which responds by sending the processor 18 the contents of the location indicated by the address-bus signals. At the lowest level, this is also the manner in which data are fetched and stored in the sectors 44 and 46 employed for the changeable parameters. But the programming in sectors 40 and/or 42 provides a higher level of access to sectors 44 and 46.

Figure 2:
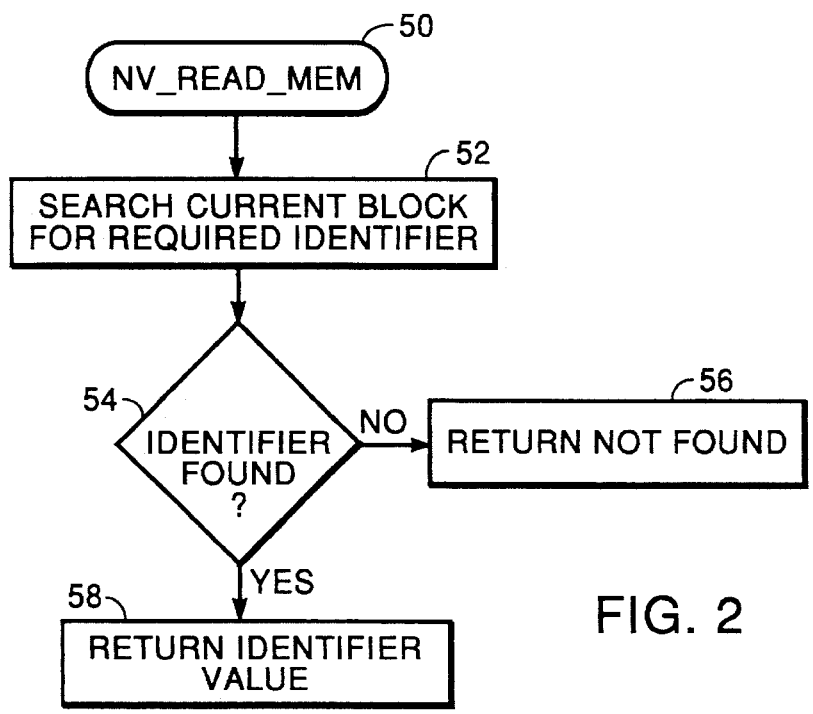
FIG. 2 is a flow chart of the read operation performed on the flash memory.

At this level, accesses occur by way of two primitive operations, NV_Read_Mem(identifier) and NV_Write_Mem(identifier, value). The routines specified by these primitives perform an associative-type access to sectors 44 and 46. To read a value in sector 44 or 46, the NV_Read Mem function is called. Its "identifier" argument indicates the meaning of the data to be fetched. For instance, the identifier may represent "volume," indicating that the data to be fetched represent the gain to be used by the audio deck 26 to drive the speaker 28. The identifier, or "tag," in an associatively operated memory is analogous to the address in a memory operated in a random-access manner: it identifies the data word without indicating its value. But it differs from a conventional address in that it identifies the data word not by its physical location in a memory circuit but by the value to be found in a "tag" part of the location that contains the data-word of interest in a second, "information" part of that location. Reference to FIG. 2 will make this concept clear.

FIG. 2 depicts the NV_Read_Mem function, as block 50 indicates. When the telephone is first turned on, the processor 18 inspects sectors 44 and 46 and determines, in a manner that will become apparent from the description below, which one has stored data in it. It then sets a flag in RAM 20 to designate this sector as the active sector, from which the changeable parameters are to be fetched and to which they are to be written. In step 52, the central processing unit 18 searches the memory locations of the sector thus identified, treating each location as having a tag part and an information part. It compares the tag part of each such location with the "identifier" argument until it finds the identifier or determines that the active sector contains no such identifier. In the latter case, the function returns a "return not found" indication, as blocks 54 and 56 indicate. But if it finds a location whose tag matches the identifier, it returns the contents of that location's information part, as block 58 indicates.

Figure 3:
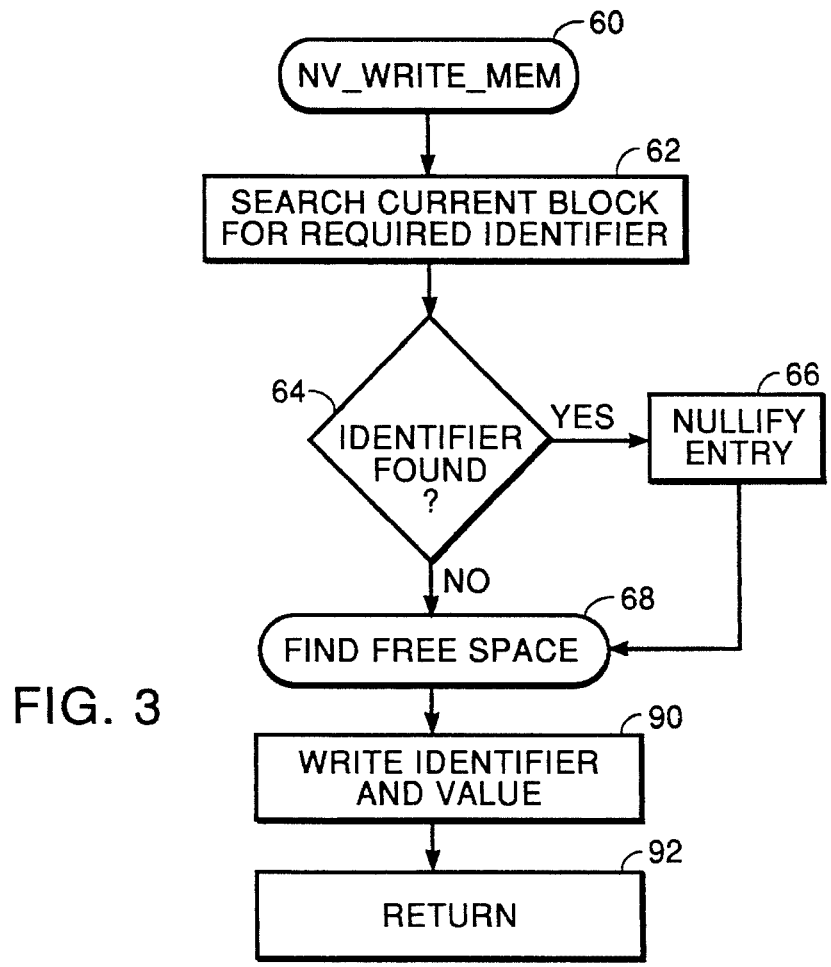
FIG. 3 is a flow chart of the writing operation performed on the flash memory.

FIG. 3 depicts the NV_Write_Mem routine, as block 60 indicates. As was indicated above, the function call for this routine passes two arguments, namely, an identifier and a value. Like the routine of FIG. 2, that of FIG. 3 involves searching the active sector for a location whose tag part contains the identifier argument. Block 62 represents this search. If the search results in finding the properly tagged location, the routine ordinarily "nullifies" that location by writing all ZEROs into its tag part. This a reserved tag value, which indicates that the location's contents are no longer valid. (Actually, any predetermined value—except all ONEs—could be used for this purpose, but we prefer all ZEROs.)

In some embodiments of the invention, the location may not always be nullified in this situation; if the information contents can be changed to the desired value by writing only ZEROs, then the contents will not have to be nullified in applications in which the consequent reduction in erasure frequency justifies the extra comparison step required to determine whether such a modification can be made. But we do not make such a comparison in the illustrated embodiment, as blocks 64 and 66 indicate.

Figure 4:
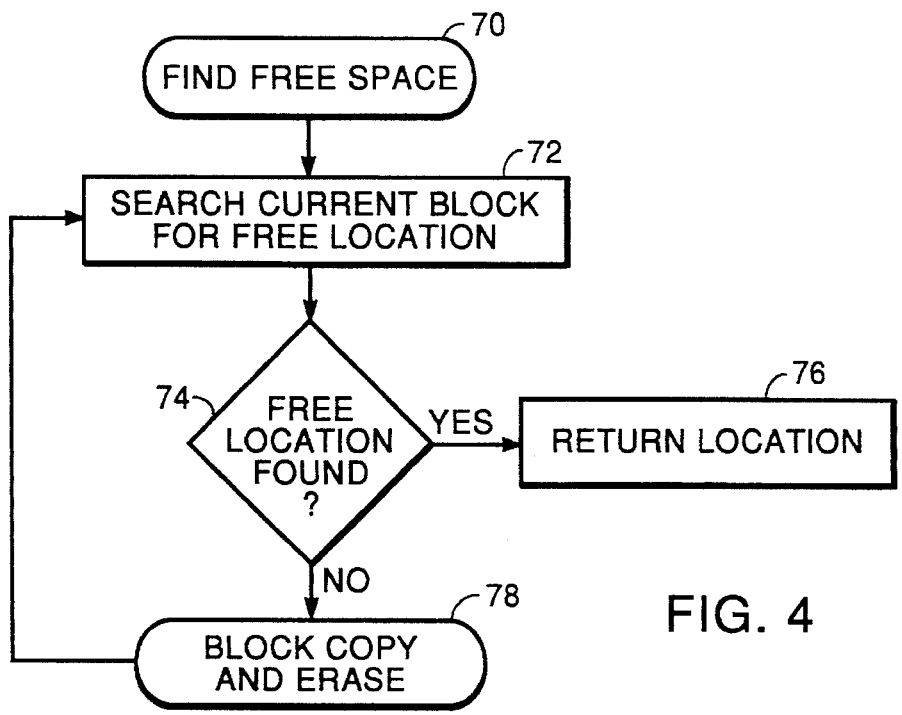
FIG. 4 is a flow chart of a "find free space" routine employed in the writing operation of FIG. 4.

Regardless of whether the write routine in the illustrated embodiment finds the tag, therefore, it proceeds to call a "find free space" subroutine in a step represented by block 68. FIG. 4 represents this routine, as block 70 of that drawing indicates. The purpose of the "find free space" routine is to find a location in the active sector that has not already been used. Block 72 represents searching the sector's memory locations until it finds one whose tag contents are all ONEs. This is the value that the tag (and, indeed, the information) part of every location in a sector assumes when that location is erased, and it is a tag value reserved to indicate vacancy, i.e., to indicate that the location is not yet in use. If the routine finds such a location, it returns the address of that location, as blocks 74 and 76 indicate.

In the intended application, it ordinarily does find such a location, because 4K of memory is many times as much as is needed to contain the changeable parameters that require non-volatile storage. But the sector will eventually be exhausted; after a large number of parameter changes, the routine of FIG. 4 will find no location in the currently active sector that has not been used. When that happens, the routine of FIG. 4 calls a "block copy and erase" subroutine in a step represented by block 78.

Figure 5:
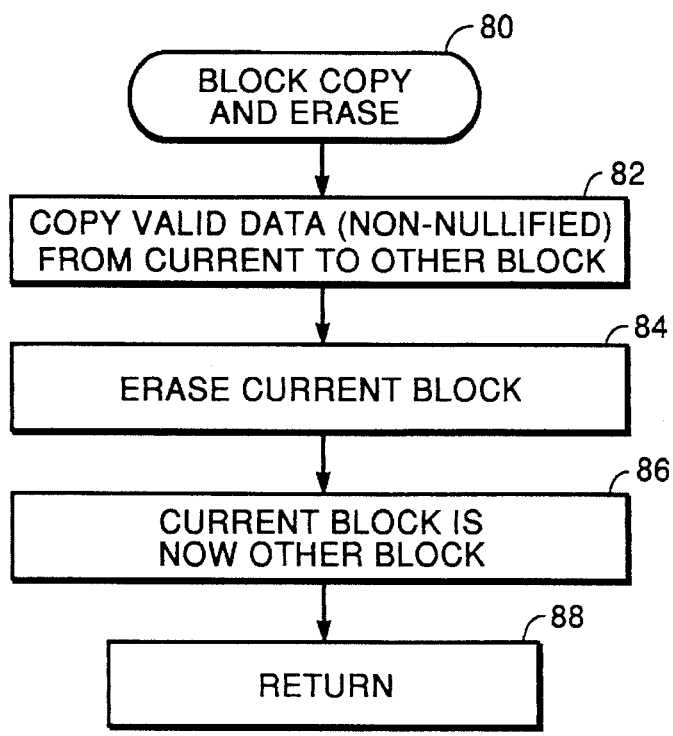
FIG. 5 is a "block erase and copy" routine that the "find free space" routine uses.

As its block 80 indicates, FIG. 5 depicts this routine. In the steps of blocks 82, 84, 86, and 88, the routine of FIG. 5 copies all valid data from the currently active one of sectors 44 and 46 to the other, erases the currently active sector, thereby setting the values of all bit cells in that sector to the logic-ONE state, toggles the active-sector-indicating flag in the RAM 20 to indicate that the erstwhile "other" sector is now the active sector, and returns control to the FIG. 4 routine. The FIG. 4 routine then returns the address of the first location in the newly active sector to the routine of FIG. 3. As blocks 90 and 92 indicate, that routine then writes into the location thus identified the identifier and value arguments of the function call that invoked it, and the write operation is finished.

From the foregoing description, it will be apparent that the invention enables non-changing program instructions and changeable parameters to be stored in the same device without the size penalties that would result from doing so in an EEPROM and without the difficulties that would otherwise have attended the use of a flash memory for this purpose. The invention therefore constitutes a significant advance in the art.

We claim:

1. For storing a data value in a memory circuit comprising at least one sector that includes a plurality of memory locations, each of which comprises a plurality of bit cells, the memory circuit being of the type in which bit cells can be set individually to a first binary value but a bit cell in a given sector can be set to the second binary value only simultaneously with all other bit cells in the same sector, a method comprising the steps of:

A) searching memory locations by treating each location as comprising separate tag and information parts and determining whether the tag part contains a predetermined tag value;

B) if the tag part of a memory location contains a predetermined tag value and the information part does not contain the data value or a value that can be changed to the data value by only replacing one or more ONEs with ZEROs, changing the contents of that memory location's tag part by writing at least one ZERO therein so that the tag part no longer contains the predetermined tag value;

C) finding a memory location whose tag part contains a predetermined vacancy value;

D) writing the predetermined tag value into that memory location's tag part; and E) writing the data value into the information part of that memory location.

2. For storing a data value in a memory circuit comprising a plurality of sectors, each of which comprises a plurality of memory locations comprising respective pluralities of bit cells, the memory circuit being of the type in which bit cells can be set individually to a first binary value but a bit cell in a given sector can be set to the second binary value only simultaneously with all other bit cells in the same sector, a method comprising the steps of:

A) fetching machine instructions from a first of the sectors; and,

B) in accordance with the fetched instructions:
  i) searching memory locations of a second of the sectors by treating each location as comprising separate tag and information parts and determining whether the tag part contains a predetermined tag value;
  ii) if the tag part of a memory location contains the predetermined tag value and the information part does not contain the data value or a value that can be changed to the data value by only replacing one or more ONEs with ZEROs, changing the contents of that memory location's tag part by writing at least one ZERO therein so that the tag part no longer contains the predetermined tag value;
  iii) finding a memory location whose tag part contains a predetermined vacancy value;
  iv) writing the predetermined tag value into that memory location's tag part; and
  v) writing the data value into the information part of that memory location.

3. A portable telephone comprising:
A) a radio section responsive to processor data signals applied thereto to generate radio signals and responsive to radio signals received thereby to generate radio-section data signals;
B) an audio section responsive to processor data signals applied thereto to generate sonic signals and responsive to sound signals received thereby to generate audio-section data signals;
C) a central processing unit, connected to apply processor data signals to the audio and radio sections and receive the radio- and audio-section data signals, for fetching machine instructions from a program address space and executing the instructions thus fetched; and
D) a sectored non-volatile memory circuit comprising a plurality of sectors, each of which includes a plurality of memory locations comprising respective pluralities of bit cells, the memory circuit being of the type in which bit cells can be set individually to a first binary value but a bit cell in a given sector can be set to the second binary value only simultaneously with all other bit cells in the same sector, the memory circuit being connected to place into the program address space of the central processing unit a first of the sectors, the first sector containing machine instructions that direct the central processing unit to process the audio and radio data signals, apply control signals to the audio and radio sections, and change the contents of a second sector so as to store a data value in the second sector by:
  i) searching memory locations in the second sector by treating each location as comprising separate tag and information parts and determining whether the tag part contains a predetermined tag value;
  ii) if the tag part of a memory location contains the predetermined tag value and the information part does not contain the data value or a value that can be changed to the data value by only replacing one or more ONEs with ZEROs, changing the contents of that memory location's tag part by writing at least one ZERO therein so that the tag part no longer contains the predetermined tag value;
  iii) finding a memory location whose tag part contains a predetermined vacancy value;
  iv) writing the predetermined tag value into that memory location's tag part; and
  v) writing the data value into that memory location's information part.

4. A portable telephone as defined in claim 3 wherein the first sector contains machine instructions that direct the central processing unit to retrieve a data value from the second sector by:
  1) searching memory locations of the second sector by treating each location as comprising separate tag and information parts and determining whether the tag part contains a predetermined tag value; and
  2) if the tag part of a memory location contains the predetermined tag value, fetching the contents of that memory location's information part.

5. A portable telephone as defined in claim 3 wherein the first sector contains machine instructions that direct the central processing unit to retrieve a data value from the second sector by:
A) searching memory locations of the second sector by treating each location as comprising separate tag and information parts and determining whether the tag part contains a predetermined tag value; and
B) if the tag part of a memory location contains the predetermined tag value, fetching the contents of that memory location's information part.

* * * * *